(12) United States Patent
Everett

(10) Patent No.: US 10,419,034 B2
(45) Date of Patent: Sep. 17, 2019

(54) SATELLITE COMMUNICATION SYSTEM ARCHITECTURE FOR ENHANCED PARTIAL PROCESSING

(71) Applicant: The Boeing Company, Chicago, IL (US)

(72) Inventor: Matthew M. Everett, Torrance, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/884,156

(22) Filed: Jan. 30, 2018

(65) Prior Publication Data

US 2019/0238265 A1    Aug. 1, 2019

(51) Int. Cl.
  *H03M 13/29* (2006.01)
  *H04B 7/185* (2006.01)
  *H04L 1/00* (2006.01)

(52) U.S. Cl.
  CPC .... *H03M 13/2903* (2013.01); *H04B 7/18508* (2013.01); *H04B 7/18513* (2013.01); *H04L 1/0043* (2013.01); *H04L 1/0052* (2013.01); *H04B 7/18526* (2013.01)

(58) Field of Classification Search
  CPC ................. H03M 13/2903; H04B 7/18513
  See application file for complete search history.

(56) References Cited

U.S. PATENT DOCUMENTS 6,138,261 A * 10/2000 Wilcoxson ............ H03M 13/15
                                                  370/307
6,157,642 A * 12/2000 Sturza ................ H04B 7/18521
                                                  370/316

(Continued)

FOREIGN PATENT DOCUMENTS

EP    0893891    1/1999
EP    1199828    4/2002

OTHER PUBLICATIONS

Chuang et al., "2025 and Beyond: The Next Generation of Protected Tactical Communications," Crosslink Magazine, Sep. 1, 2014, pp. 1-9, retrieved on Jan. 30, 2018 from the Internet: <http://www.aerospace.org/crosslinkmag/fall-2014/2025-and-beyond-the-next-generation-of-protected-tactical-communications/>.

(Continued)

*Primary Examiner* — Joseph D Torres
(74) *Attorney, Agent, or Firm* — Haynes and Boone LLP

(57) ABSTRACT

Systems, methods, and apparatus for enhanced partial processing of satellite user data are disclosed. In one or more embodiments, a disclosed method for processing satellite data comprises encoding with an outer encoder in a transmitting terminal, modulating with a transmit modulator in the transmitting terminal, demodulating with a satellite demodulator in a satellite, encoding with an inner encoder in the satellite, modulating with a satellite modulator in the satellite, demodulating with a receive demodulator in a receiving terminal, decoding with an inner decoder in the receiving terminal, and decoding with an outer decoder in the receiving terminal. In one or more embodiments, the outer encoder and/or the inner encoder is operable to perform forward error correction (FEC) encoding. In at least one embodiment, the outer decoder and/or the inner decoder is operable to perform FEC decoding.

20 Claims, 9 Drawing Sheets

(56) References Cited

U.S. PATENT DOCUMENTS

| | | | |
|---|---|---|---|
| 6,263,466 B1* | 7/2001 | Hinedi | H03M 13/2903 |
| | | | 370/389 |
| 6,320,850 B1 | 11/2001 | Perahia et al. | |
| 9,007,984 B1 | 4/2015 | Tan et al. | |
| 2014/0153625 A1* | 6/2014 | Vojcic | H04L 1/005 |
| | | | 375/224 |
| 2018/0062788 A1* | 3/2018 | Mayer | H04B 7/18515 |

OTHER PUBLICATIONS

Bettinger, Dave, "Intelligent Payloads: The Key to Ensuring Greater Return on HTS," iDirect, Apr. 7, 2014, pp. 1-2, retrieved on Jan. 30, 2018 from the Internet: <http://blog.idirect.net/intelligent-payloads-the-key-to-ensuring-greater-return-on-hts/>.

Cisco Systems, Inc., "IRIS Space Router Key Capabilities and Benefits," White Paper, 2011, pp. 1-33, Astrium, retrieved on Jan. 30, 2018 from the Internet: <https://www.cisco.com/c/dam/en_us/solutions/industries/docs/gov/IRIS_Space_Router_Key_Capabilities_and_Benefits_wp.pdf>.

\* cited by examiner

SATELLITE COMMUNICATION SYSTEM ARCHITECTURE FOR ENHANCED PARTIAL PROCESSING

GOVERNMENT LICENSE RIGHTS

This invention was made with United States Government support. The government has certain rights in this invention.

FIELD

The present disclosure relates to processing of satellite user data. In particular, it relates to enhanced partial processing of satellite user data.

BACKGROUND

Modern communications systems use forward error correction (FEC) coding in order to achieve extremely low bit error rates. In single hop systems (e.g., the transmission of data from a transmitting terminal directly to a receiving terminal), an FEC encoder in the transmitting terminal encodes an input stream of user data at a given data rate (i.e. the user data rate) to produce a stream of encoded data, which comprises extra bits. The FEC encoder outputs the stream of encoded data at a higher data rate (i.e. the encoded data rate). The ratio of the user data rate to the encoded data rate is called the code rate. This stream of encoded data is then modulated in the transmitting terminal, and transmitted to the receiving terminal, where it is demodulated. An FEC decoder in the receiving terminal then uses the extra bits generated by the FEC encoder to correct for errors introduced by the communications channel.

Satellite communications systems also employ FEC coding to achieve low bit error rates, but the fact that there are two hops (e.g., the transmission of data from a transmitting terminal to a satellite, and then from the satellite to a receiving terminal) increases the number of architectural options. Each option involves different arrangements of modulators, demodulators, FEC encoders, and FEC decoders. Better performance can be achieved by performing more processing onboard the satellite at the expense of increased cost and complexity. Looking at the options studied to date, this tradeoff favors simpler satellites because the level of complexity needed to achieve significantly better performance has been cost prohibitive.

There is therefore a need for an improved satellite communications system architecture that provides better performance than a simple transponder architecture without adding significant cost and complexity to the satellite.

SUMMARY

The present disclosure relates to a method, system, and apparatus for enhanced partial processing of satellite user data. In one or more embodiments, a method for processing data comprises encoding, with an outer encoder in a transmitting terminal, data to generate an outer code. The method further comprises modulating, with a transmit (Tx) modulator in the transmitting terminal, the outer code, interleaved outer code, or framed outer code to generate modulated outer code. Also, the method comprises demodulating, with a satellite demodulator in a satellite, the modulated outer code to generate demodulated outer code. In addition, the method comprises encoding, with an inner encoder in the satellite, the demodulated outer code to generate inner code. Additionally, the method comprises modulating, with a satellite modulator in the satellite, the inner code, interleaved inner code, or framed inner code to generate modulated inner code. Also, the method comprises demodulating, with a receive (Rx) demodulator in a receiving terminal, the modulated inner code to generate demodulated inner code. In addition, the method comprises decoding, with an inner decoder in the receiving terminal, the demodulated inner code, deframed inner code, or deinterleaved inner code to generate recovered outer code. Further, the method comprises decoding, with an outer decoder in the receiving terminal, the recovered outer code, deframed outer code, or deinterleaved outer code to generate recovered data.

In one or more embodiments, the method further comprises interleaving, by an outer interleaver in the transmitting terminal, the outer code to generate the interleaved outer code, prior to the modulating by the transmit modulator; and/or frame processing, by a transmit frame processor in the transmitting terminal, the outer code or the interleaved outer code to generate framed outer code, prior to the modulating by the transmit modulator.

In at least one embodiment, the method further comprises interleaving, by a satellite interleaver in the satellite, the inner code to generate the interleaved inner code, prior to the modulating by the satellite modulator; and/or frame processing, by a satellite frame processor in the satellite, the inner code or the interleaved inner code to generate the framed inner code, prior to the modulating by the satellite modulator.

In one or more embodiments, the method further comprises frame processing, by a first receive frame processor in the receiving terminal, the demodulated inner code to generate deframed inner code, prior to the decoding by the inner decoder; and/or deinterleaving, by an inner deinterleaver in the receiving terminal, the demodulated inner code or the deframed inner code to generate the deinterleaved inner code, prior to the decoding by the inner decoder.

In at least one embodiment, the method further comprises frame processing, by a second receive frame processor in the receiving terminal, the recovered outer code to produce deframed outer code, prior to the decoding by the outer decoder; and/or deinterleaving, by an outer deinterleaver in the receiving terminal, the recovered outer code or the deframed outer code to generate the deinterleaved outer code, prior to the decoding by the outer decoder.

In one or more embodiments, the data is communication data, command data, and/or user data. In at least one embodiment, the outer encoder and/or the inner encoder performs forward error correction (FEC) encoding. This FEC code may have its own inner and outer codes, which are distinct from the inner and outer codes as defined in the present disclosure. In some embodiments, the outer decoder and/or the inner decoder performs FEC decoding.

In at least one embodiment, the outer decoder corresponds to the outer encoder, and the inner decoder corresponds to the inner encoder. In some embodiments, the transmitting terminal and the receiving terminal are each a ground station, a mobile device, or a vehicle.

In one or more embodiments, a system for processing data comprises an outer encoder in a transmitting terminal to encode data to generate an outer code. The system further comprises a transmit modulator in the transmitting terminal to modulate the outer code, interleaved outer code, or framed outer code to generate modulated outer code. Also, the system comprises a satellite demodulator in a satellite to demodulate the modulated outer code to generate demodulated outer code. In addition, the system comprises an inner encoder in the satellite to encode the demodulated outer code to generate inner code. Additionally, the system comprises a satellite modulator in the satellite to modulate the inner code, interleaved inner code, or framed inner code to generate modulated inner code. Also, the system comprises a receive demodulator in a receiving terminal to demodulate the modulated inner code to generate demodulated inner code. In addition, the system comprises an inner decoder in the receiving terminal to decode the demodulated inner code, deframed inner code, or deinterleaved inner code to generate recovered outer code. Further, the system comprises an outer decoder in the receiving terminal to decode the recovered outer code, deframed outer code, or deinterleaved outer code to generate recovered data.

In at least one embodiment, the system further comprises an outer interleaver in the transmitting terminal to interleave the outer code to generate the interleaved outer code, prior to the modulating by the transmit modulator; and/or a transmit frame processor in the transmitting terminal to frame process the outer code or the interleaved outer code to generate framed outer code, prior to the modulating by the transmit modulator.

In one or more embodiments, the system further comprises a satellite interleaver in the satellite to interleave the inner code to generate the interleaved inner code, prior to the modulating by the satellite modulator; and/or a satellite frame processor in the satellite to frame process the inner code or the interleaved inner code to generate the framed inner code, prior to the modulating by the satellite modulator.

In at least one embodiment, the system further comprises a first receive frame processor in the receiving terminal to frame process the demodulated inner code to generate deframed inner code, prior to the decoding by the inner decoder; and/or an inner deinterleaver in the receiving terminal to deinterleave the demodulated inner code or the deframed inner code to generate the deinterleaved inner code, prior to the decoding by the inner decoder.

In one or more embodiments, the system further comprises a second receive frame processor in the receiving terminal to frame process the recovered outer code to produce deframed outer code, prior to the decoding by the outer decoder; and/or an outer deinterleaver in the receiving terminal to deinterleave the recovered outer code or the deframed outer code to generate the deinterleaved outer code, prior to the decoding by the outer decoder.

In at least one embodiment, the outer encoder and/or the inner encoder is operable to perform forward error correction (FEC) encoding. This FEC code may have its own inner and outer codes, which are distinct from the inner and outer codes as defined in the present disclosure. In some embodiments, the outer decoder and/or the inner decoder is operable to perform FEC decoding.

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

Figure 7A:
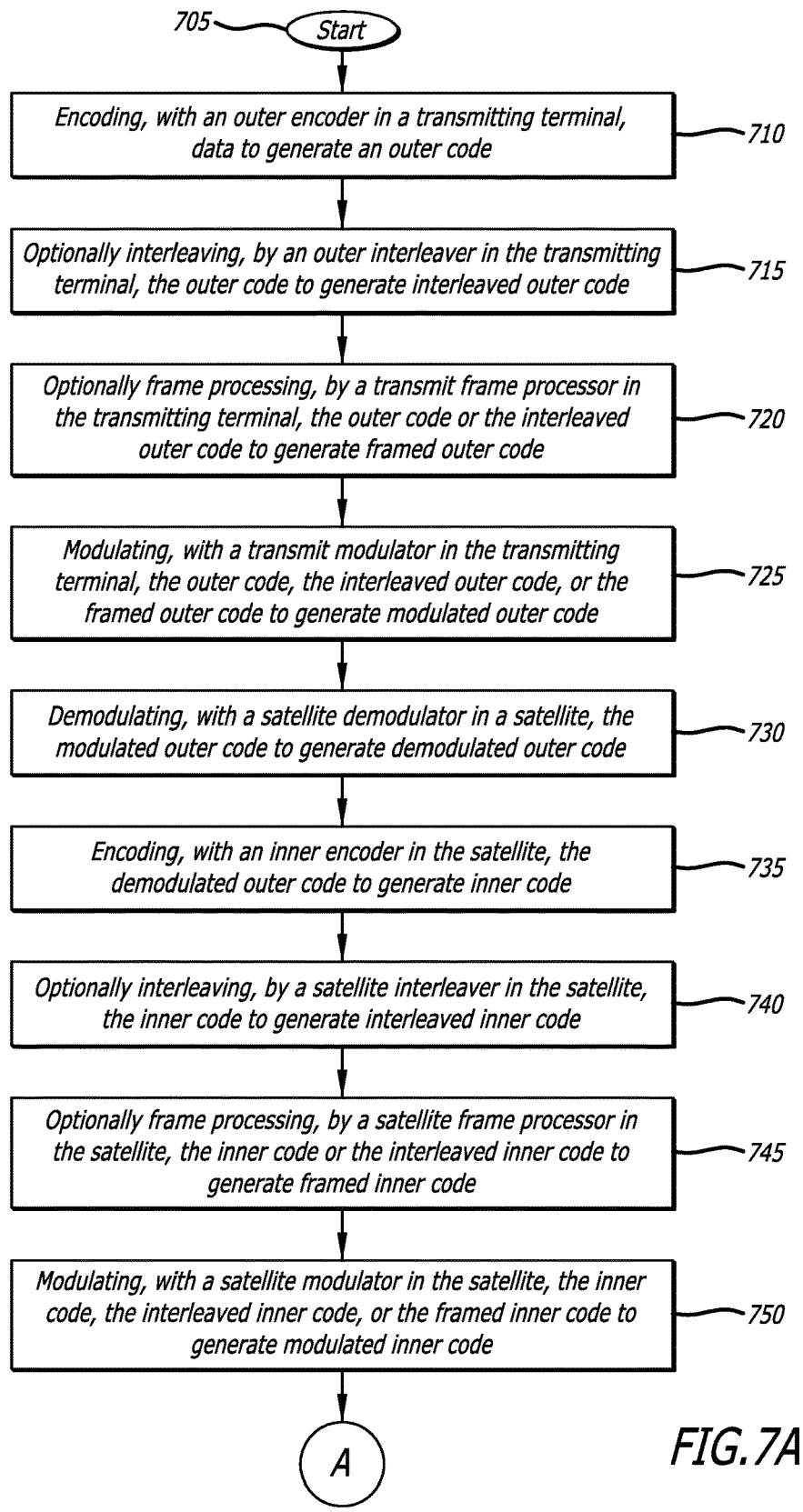
Figure 7B:
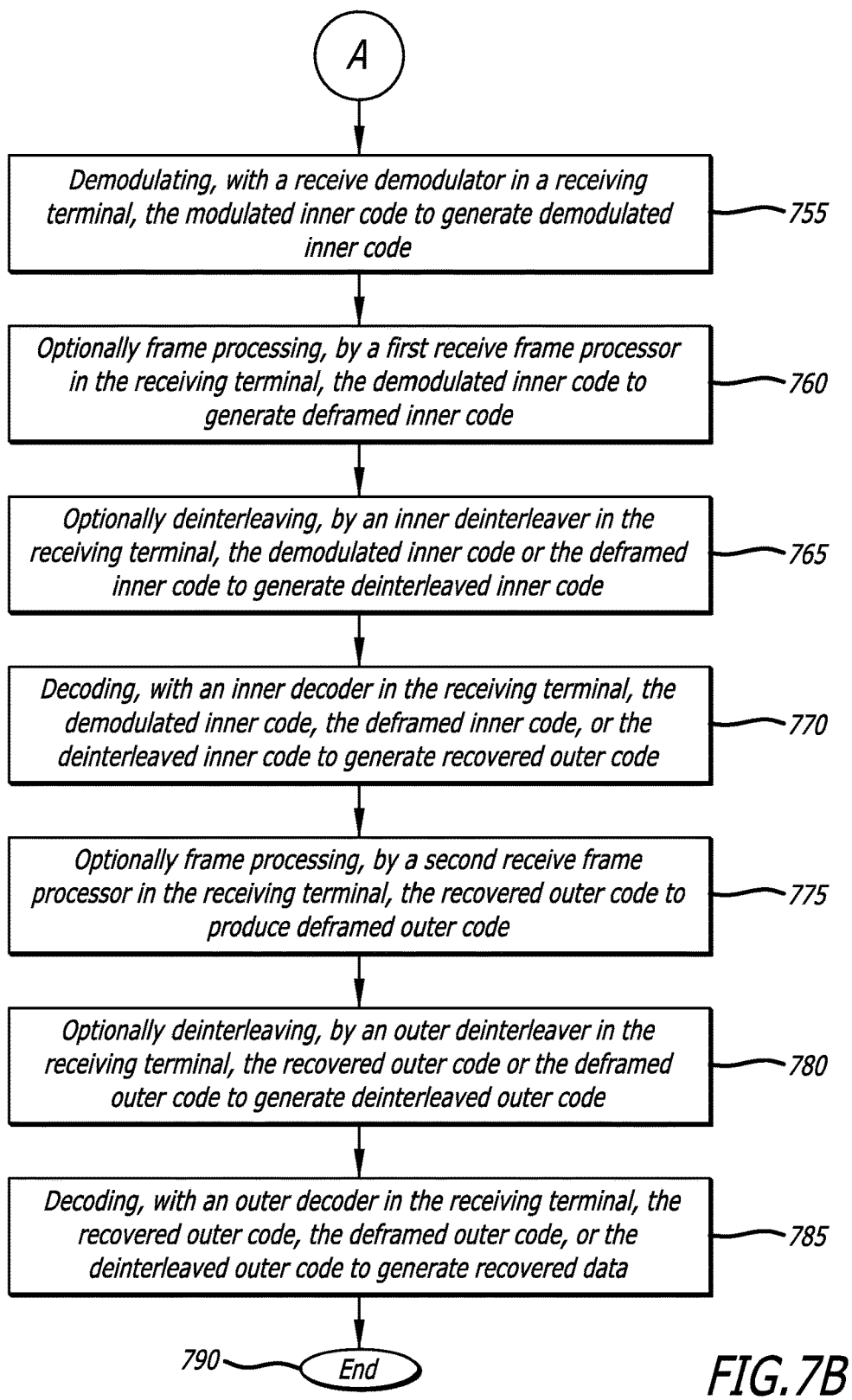

FIGS. 7A and 7B together are a flow chart showing the disclosed method for enhanced partial processing of satellite user data, in accordance with at least one embodiment of the present disclosure.

Figure 8:
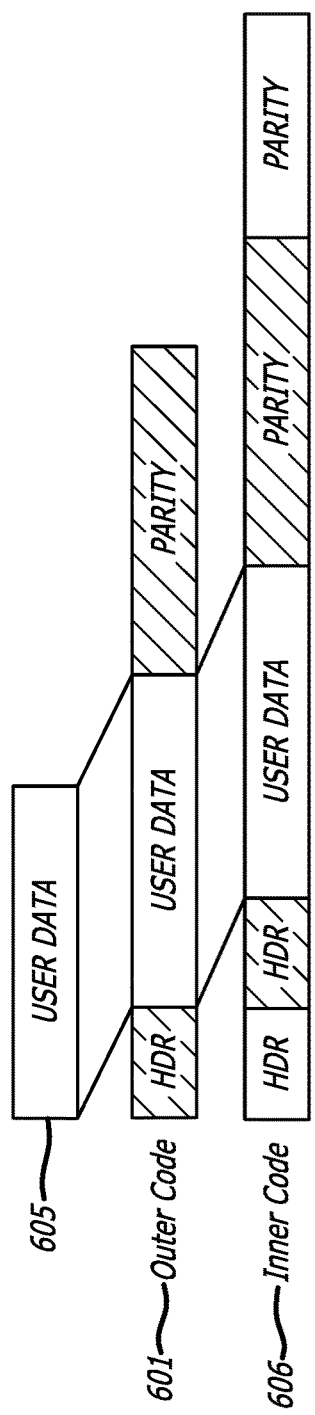

FIG. 8 is a schematic diagram showing an exemplary forward error correction (FEC) concatenated code for the outer code and an exemplary FEC concatenated code for the inner code that may be employed by the disclosed system for enhanced partial processing of satellite user data, in accordance with at least one embodiment of the present disclosure.

DESCRIPTION

The methods and apparatus disclosed herein provide an operative system for enhanced partial processing of satellite user data. In one or more embodiments, the system of the present disclosure provides a satellite architecture (refer to FIG. 6) that allows for significant performance improvement over the conventionally used transponder and partial processing satellite architectures (e.g., refer to FIGS. 3 and 4, respectively) without the complexity of the full processing satellite architecture (e.g., refer to FIG. 5). This disclosed satellite architecture (refer to FIG. 6) preserves the encoder on the satellite but eliminates the decoder, which is very complex and costly. It should be noted that while modern FEC decoders are complex and iterative, the corresponding encoders are extremely simple and low cost to implement at very high data rates.

Currently, there are three main satellite communications systems architectures that are conventionally used. These are: (1) a transponder satellite system architecture (e.g., refer to FIG. 3), (2) a partial processing satellite system architecture (e.g., refer to FIGS. 4), and (3) a full processing satellite system architecture (e.g., refer to FIG. 5). Each of these architectures has their own specific advantages and disadvantages.

In the transponder satellite system architecture, the satellite retransmits the received signal without any significant processing, such as demodulation or decoding. This architecture has the advantage that it places the least burden on the satellite design. However, it has the significant disadvantage that the FEC decoder needs to correct for noise from both the uplink and the downlink signals. For this system, when the uplink signal is operating near the minimum required signal-to-noise ratio (SNR), the downlink signal must operate at very high SNR in order to close the link, and vice-versa.

In the partial processing satellite system architecture, the satellite demodulates and then remodulates the received signal. In most cases, this architecture does not provide any performance improvement over the transponder satellite system architecture. The primary reason is that modern FEC codes rely significantly on a confidence value for each demodulated bit, called "soft decision information," provided by the demodulator. By introducing a demodulator onto the satellite, the soft decision information for the uplink signal is lost. For systems that are uplink signal limited, the loss of this information can result in a two (2) to four (4) decibel (dB) increase in decoder implementation loss. It is difficult to overcome this 2-4 dB penalty, but this architecture is still useful in some circumstances. For example, when terminals need to communicate with the satellite as well as other terminals, the satellite needs a demodulator in order to process messages from terminals. This architecture also enables system capabilities like space-based dynamic switching and space-based dynamic resource allocation.

In the full processing satellite system architecture, the satellite first demodulates and decodes the received signal, and then reencodes and remodulates the resultant signal. This architecture has the best performance of the three satellite communications systems architectures. Both the uplink and downlink signals can operate at near theoretical limits with near error-free performance. The significant downside of this architecture is the fact that the satellite needs not just a demodulator, but also a decoder, and this decoder needs to operate at the maximum data rate of the system. Since modern FEC decoders operate iteratively, meaning that they slowly converge on the correct answer, the burden on the satellite is substantial.

Another drawback of the full processing satellite system architecture is that the system cannot take advantage of advances in forward error correction technology. Whereas the FEC is implemented entirely outside the satellite in the transponder and partial processing architectures, it is embedded in the satellite design in the full processing satellite system architecture. In order to achieve performance at the maximum system data rate, algorithms need to be implemented in non-reprogrammable application specific integrated circuits (ASICs). If newer codes are developed, then the system cannot be updated to take advantage of them.

The disclosed system, which performs enhanced partial processing, comprises a novel architecture for satellite communications systems that provides significant performance improvement over the transponder and partial processing satellite system architectures without the complexity of the full processing satellite system architecture. The key insight used to develop this system is that while modern FEC decoders are complex and iterative, the corresponding encoders are extremely simple to implement at very high data rates. As a result, the disclosed enhanced partial processing architecture preserves the encoder on the satellite (which is referred to as the inner encoder) but eliminates the decoder. In addition, the disclosed architecture employs an encoder in the transmitting terminal (which is referred to as the outer encoder). The encoder on the satellite (i.e. the inner encoder) is used to generate an inner code, and the encoder in the transmitting terminal (i.e. the outer encoder) is used to generate an outer code. The encoded data from the transmitting terminal (i.e. the outer code) is simply treated as the input data stream to the encoder on the satellite and, in some embodiments, the two codes are effectively concatenated. Two sets of decoders in series (i.e. an inner decoder and an outer decoder) are implemented in the receiving terminal to decode both the inner and outer codes.

In the disclosed enhanced partial processing satellite system architecture, the downlink signal is completely independent of uplink signal performance, and the system can operate near theoretical limits irrespective of the uplink signal. By not implementing a decoder on the satellite, the outer code suffers the 2-4 dB penalty for losing soft decision information relative to the full processing satellite system architecture. This penalty applies only to the uplink signal, and it may be preferable to provide an additional 2-4 dB of performance on the uplink signal by other means (e.g., by providing a higher uplink gain-to-noise-temperature (G/T)) than by adding a decoder on the satellite. The performance advantage in terms of required downlink signal power over using the transponder or partial processing satellite system architectures depends on the details of the uplink signal and downlink signal performance, but can be significant, especially in uplink signal limited situations.

This disclosed enhanced partial processing satellite system architecture is markedly distinct from the existing architectures, with the distinctive features being: (1) an encoder on the satellite without implementing a decoder, and (2) two sets of decoders in the receiving terminal to decode both the inner code generated by the inner encoder on the satellite and the outer code generated by the outer encoder in the transmitting terminal. The disclosed enhanced partial processing satellite system architecture provides a measurable improvement in performance over the transponder and partial processing satellite system architectures and a significant improvement in satellite complexity over the full processing satellite system architecture.

In particular, the disclosed satellite system architecture (refer to FIG. 6) employs two encoders (i.e. one encoder in the transmitting terminal (referred to as an outer encoder) and one encoder in the satellite (referred to as an inner encoder)), and employs two decoders (referred to as an inner decoder and an outer decoder) in series in the receiving terminal. During operation of the disclosed system for enhanced partial processing of satellite user data, the encoder in the transmitting terminal (i.e. the inner encoder) encodes the user data to produce the inner code, and the encoder in the satellite (i.e. the outer encoder) encodes the inner code to produce outer code. The first decoder in the receiving terminal (i.e. the inner decoder) decodes the outer code to produce the inner code, and the second decoder in the receiving terminal (i.e. the outer decoder) decodes the inner code to recover the user data.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

Embodiments of the present disclosure may be described herein in terms of functional and/or logical components and various processing steps. It should be appreciated that such components may be realized by any number of hardware, software, and/or firmware components configured to perform the specified functions. For example, an embodiment of the present disclosure may employ various integrated circuit components (e.g., memory elements, digital signal processing elements, logic elements, look-up tables, or the like), which may carry out a variety of functions under the control of one or more processors, microprocessors, or other control devices. In addition, those skilled in the art will appreciate that embodiments of the present disclosure may be practiced in conjunction with other components, and that the system described herein is merely one example embodiment of the present disclosure.

For the sake of brevity, conventional techniques and components related to satellite communications systems, and other functional aspects of the system (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

Figure 1:
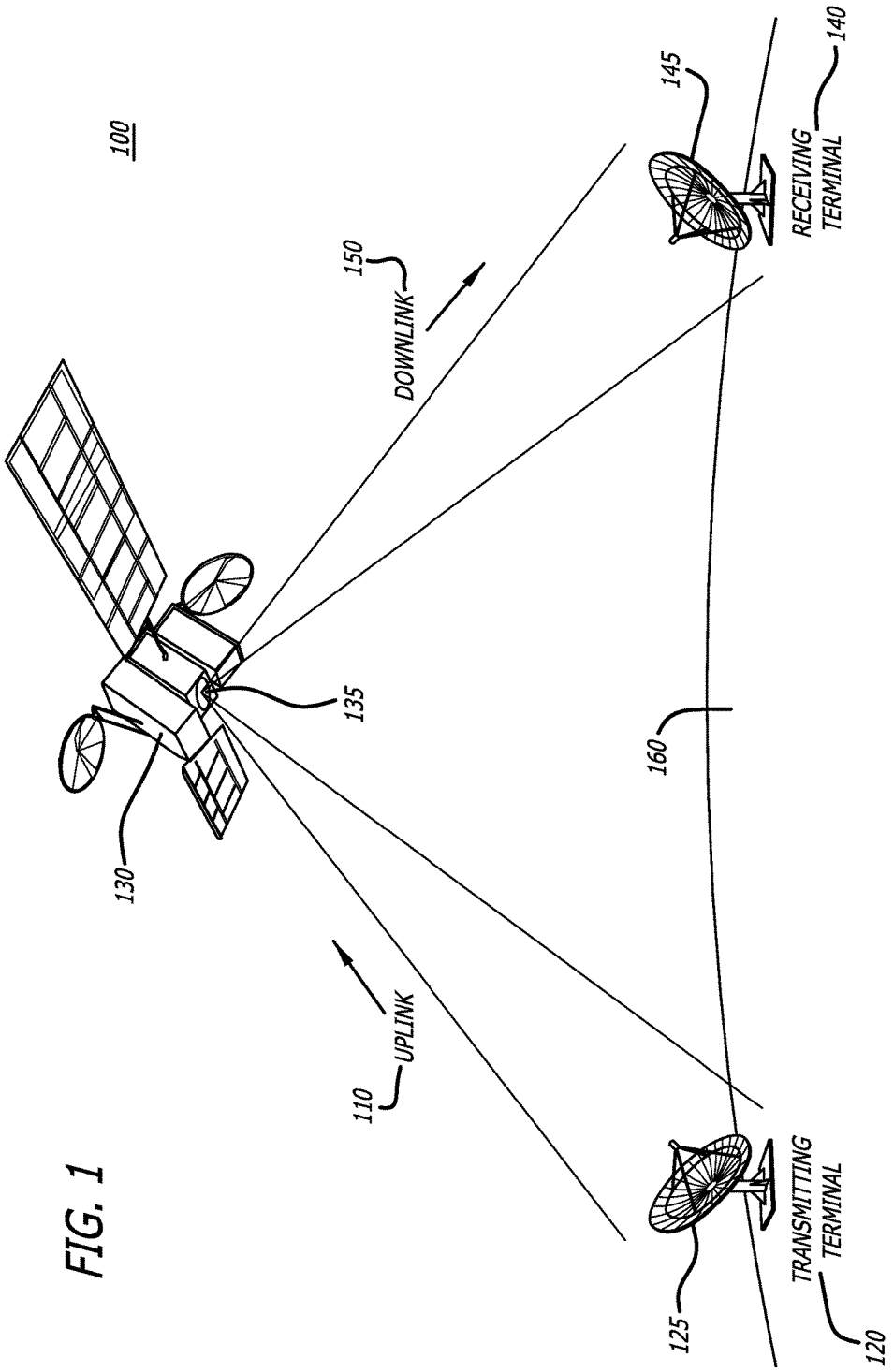
FIG. 1 is a diagram illustrating an exemplary satellite system for the disclosed system for enhanced partial processing of satellite user data, in accordance with at least one embodiment of the present disclosure.

FIG. 1 is a diagram illustrating an exemplary satellite system 100 for the disclosed system for enhanced partial processing of satellite user data, in accordance with at least one embodiment of the present disclosure. In particular, in various embodiments, the disclosed enhanced partial processing satellite system architecture may be implemented by a transmitting terminal 120, a satellite 130, and a receiving terminal 140 as shown in FIG. 1. In one or more embodiments of the present disclosure, various different types of satellites may be employed for the satellite 130 including, but not limited to, a low Earth orbiting (LEO) satellite, a medium Earth orbiting (MEO), and a geostationary Earth orbiting (GEO) satellite. In addition, in one or more embodiments, various different types of terminals may be employed for the transmitting terminal 120 and the receiving terminal 140 including, but not limited to, a ground station, a mobile device, and a vehicle. Various different types of mobile devices may be employed for the mobile device including, but not limited to, a satellite phone, a wearable communication device, a tablet computer, and a laptop computer. Also, various different types of vehicles may be employed for the vehicle including, but not limited to an airborne vehicle (e.g., an aircraft, an unmanned aerial vehicle (UAV), or another satellite), a terrestrial vehicle (e.g., an automobile or a tank), and a marine vehicle (e.g., a ship or a boat).

In FIG. 1, a transmit antenna 125 of the transmitting terminal 120 on Earth 160 is shown to be transmitting an uplink signal 110 towards a satellite antenna 135 on the satellite 130. Also, the satellite antenna 135 on the satellite 130 is shown to be transmitting a downlink signal 150 towards a receive antenna 145 on the receiving terminal 140 on Earth 160. Also, in one or more embodiments, the satellite antenna 135 used to receive the uplink signal 110 may be different from the satellite antenna 135 used to transmit the downlink signal 150 (i.e. there may be more than one satellite antenna 135 on the satellite 130 to transmit the signals). In addition, in one or more embodiments, various different types of antennas may be employed for the transmit antenna 125, the satellite antenna 135, and the receive antenna 145 including, but not limited to, a reflector antenna(s), an antenna array(s), a direct radiating horn antenna(s), a cupped dipole antenna(s), and/or a patch antenna(s). Also, in one or more embodiments, the uplink signal 110 and the downlink signal 150 are electromagnetic signals. Various different types of electromagnetic signals may be utilized for the uplink signal 110 and the downlink signal including, but not limited, to radio frequency (RF) signals of various different frequency bands.

Figure 2:
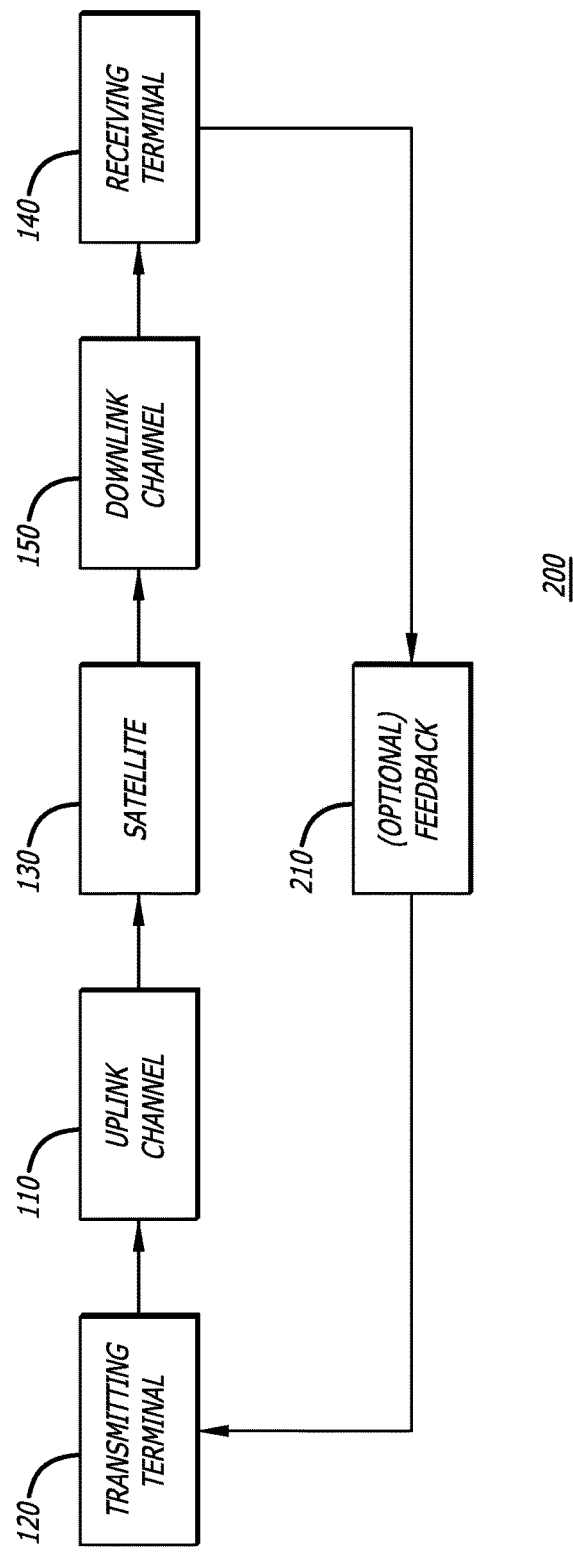
FIG. 2 is a block diagram showing an exemplary satellite system for the disclosed system for enhanced partial processing of satellite user data, in accordance with at least one embodiment of the present disclosure.

FIG. 2 is a block diagram showing an exemplary satellite system 200 for the disclosed system for enhanced partial processing of satellite user data, in accordance with at least one embodiment of the present disclosure. In this figure, the transmitting terminal 120 is shown to send the uplink channel (i.e. uplink signal) 110 to the satellite 130. Then, the satellite 130 is shown to send the downlink channel (i.e. downlink signal) 150 to the receiving terminal 140. Optionally, the receiving terminal 140 may send feedback 210 to the transmitting terminal 120. In one or more embodiments, the feedback 210 may be related to adaptive coding and modulation (e.g., to send more bits and/or send at a higher power) to improve the bit error rate (BER). It should be noted that in one or more embodiments, for example for testing purposes, the transmitting terminal 120 may be the same terminal as the receiving terminal 140.

Figure 3:
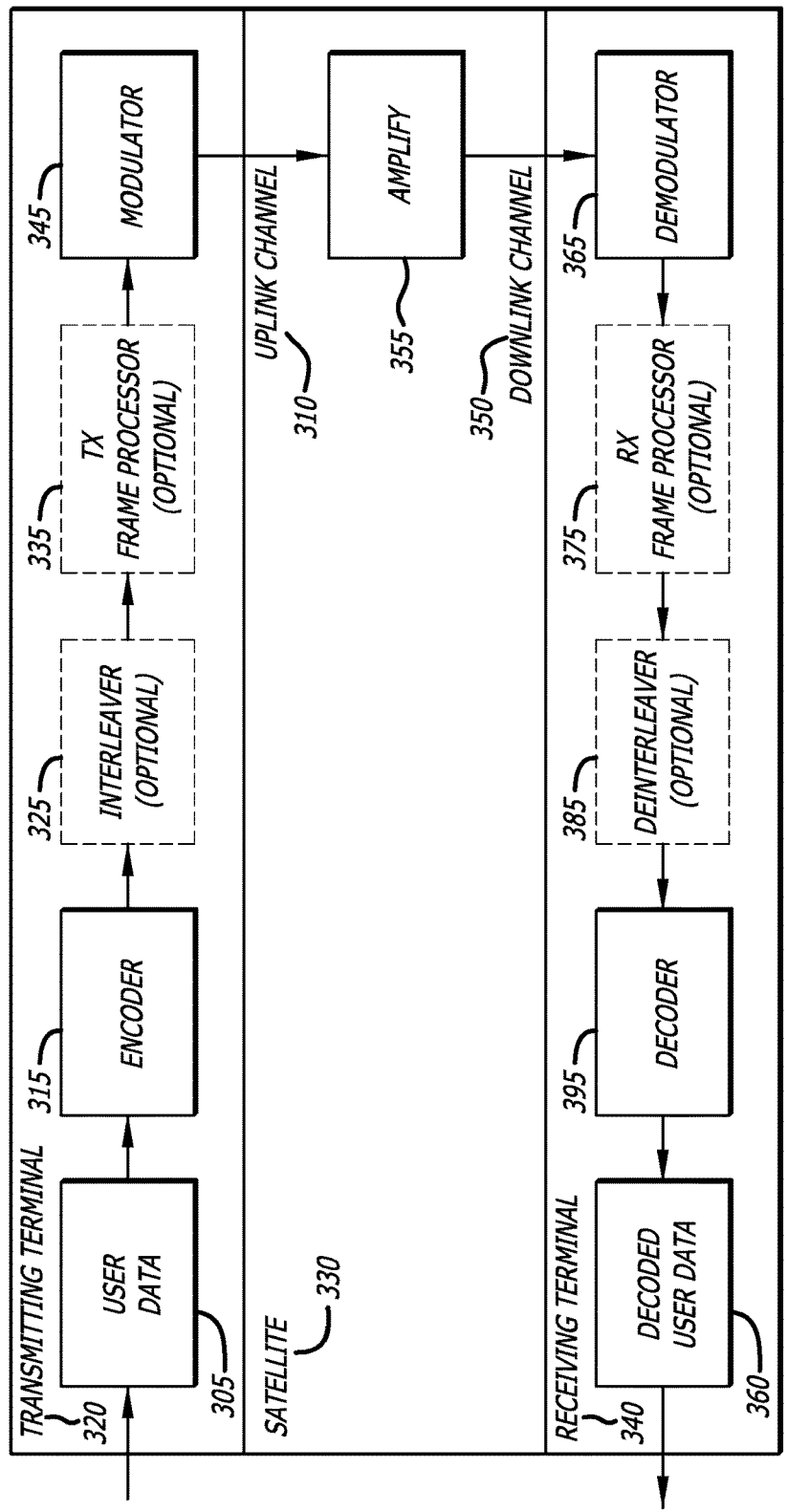
FIG. 3 is a block diagram depicting a conventional repeater transponder satellite system architecture.

FIG. 3 is a block diagram depicting a conventional repeater transponder satellite system architecture 300. In this figure, the transmitting terminal 320 is shown to include an encoder 315, and the receiving terminal 340 is shown to include a decoder 395. The satellite 330 includes an amplifier 355 used to amplify (e.g., repeat) the uplink signal 310 on the downlink signal 350.

During operation of the system of FIG. 3, the encoder 315 in the transmitting terminal 320 encodes (e.g., using an error correcting code, such as forward error correction (FEC)) data 305 (e.g., user data, communication data, and/or command data) to generate an encoded code. Then, an optional interleaver 325 in the transmitting terminal 320 may interleave (e.g., using interleavers, such as rectangular interleavers, convolutional interleavers, random interleavers, and/or S-random interleavers) the encoded code to generate interleaved encoded code. An optional transmit (Tx) frame processor 335 in the transmitting terminal 320 may frame process (e.g., inserting headers into the code) the encoded code or the interleaved encoded code to generate framed encoded code. Then, a modulator 345 in the transmitting terminal 320 modulates the encoded code, the interleaved encoded code, or the framed encoded code to generated modulated encoded code.

Then, the modulated encoded code is transmitted from a transmit antenna (not shown) at the transmitting terminal 320 to a satellite antenna (not shown) on the satellite 330 via an uplink signal 310. An amplifier 355 on the satellite 330 then amplifies the modulated encoded code to generate amplified modulated encoded code. The amplified modulated encoded code is transmitted from the satellite antenna (not shown) to a receive antenna (not shown) in the receiving terminal 340 via a downlink signal 350.

Then, a demodulator 365 in the receiving terminal 340 demodulates the amplified modulated encoded code to generate demodulated encoded code. An optional receive (Rx) frame processor 375 in the receiving terminal 340 may frame process (e.g., remove the previously inserted headers) the demodulated encoded code to generate deframed encoded code. In addition, an optional deinterleaver 385 in the receiving terminal 340 may deinterleave (e.g., undo the previously used interleavers) the demodulated encoded code or the deframed encoded code to generate deinterleaved encoded code. Then, a decoder 395 in the receiving terminal 340 decodes the demodulated encoded code, the deframed encoded code, or the deinterleaved encoded code to generate decoded data (i.e. the recovered data) 360. It should be noted that the decoder 395 corresponds (e.g., uses the same coding algorithms) with the encoder 315 in the transmitting terminal 320.

Figure 4:
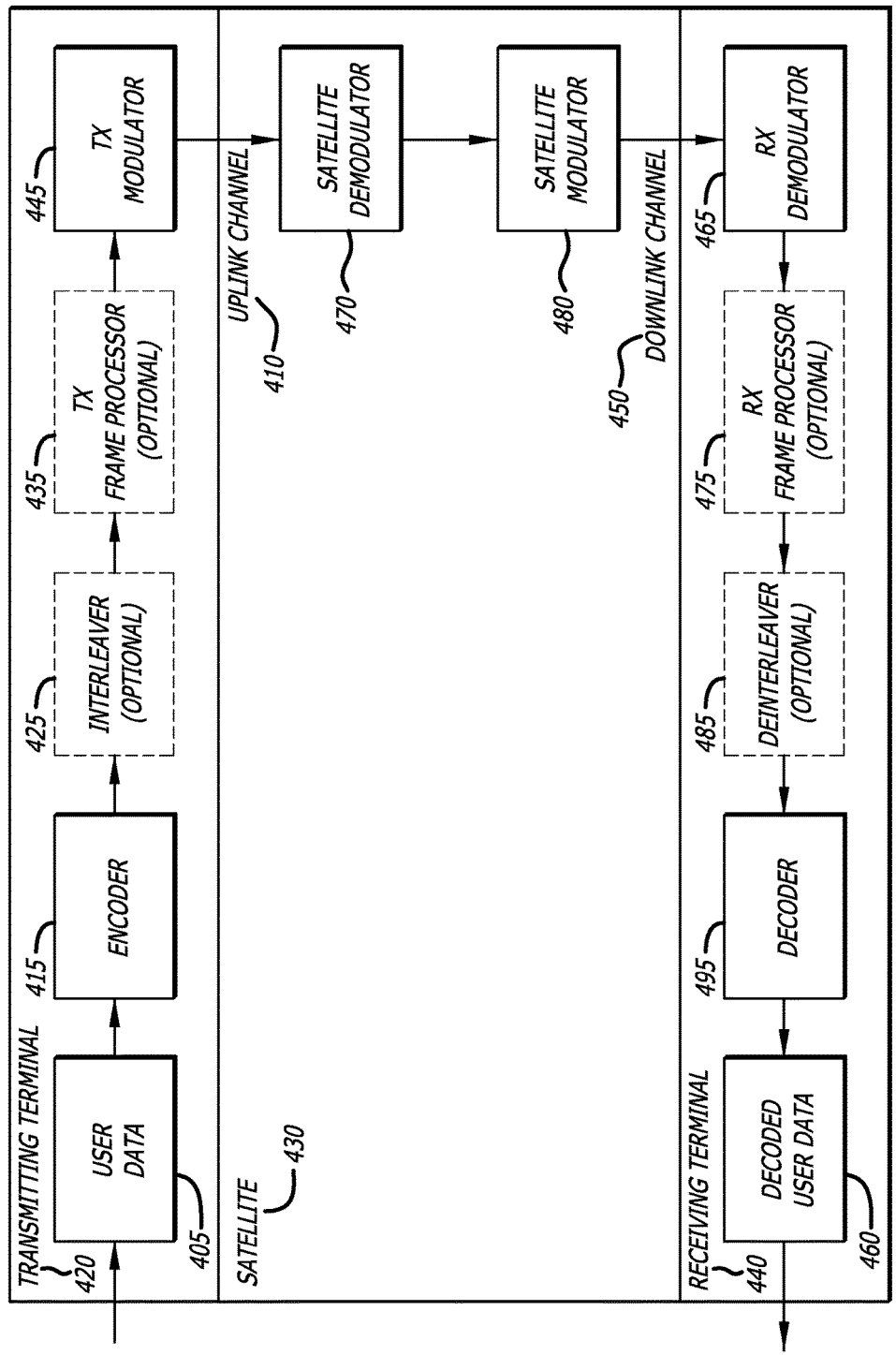
FIG. 4 is a block diagram showing a conventional partial processing satellite system architecture.

FIG. 4 is a block diagram showing a conventional partial processing satellite system architecture 400. In this figure, the transmitting terminal 420 is shown to include an encoder 415, and the receiving terminal 440 is shown to include a decoder 495. The satellite 430 includes a satellite demodulator 470 to demodulate the uplink signal 410, and includes a satellite modulator 480 to modulate the demodulated uplink signal, which is then sent on the downlink signal 450.

During operation of the system of FIG. 4, the encoder 415 in the transmitting terminal 420 encodes (e.g., using an error correcting code, such as forward error correction (FEC)) data 405 (e.g., user data, communication data, and/or command data) to generate an encoded code. Then, an optional interleaver 425 in the transmitting terminal 420 may interleave (e.g., using interleavers, such as rectangular interleavers, convolutional interleavers, random interleavers, and/or S-random interleavers) the encoded code to generate interleaved encoded code. An optional Tx frame processor 435 in the transmitting terminal 420 may frame process (e.g., inserting headers into the code) the encoded code or the interleaved encoded code to generate framed encoded code. Then, a Tx modulator 445 in the transmitting terminal 420 modulates the encoded code, the interleaved encoded code, or the framed encoded code to generate a first modulated encoded code.

Then, the first modulated encoded code is transmitted from a transmit antenna (not shown) at the transmitting terminal 420 to a satellite antenna (not shown) on the satellite 430 via an uplink signal 410. A satellite demodulator 470 in the satellite 430 then demodulates the first modulated encoded code to generate a first demodulated encoded code. Then, a satellite modulator 480 in the satellite 430 modulates the first demodulated encoded code to generate a second modulated encoded code. The second modulated encoded code is transmitted from the satellite antenna (not shown) to a receive antenna (not shown) in the receiving terminal 440 via a downlink signal 450.

Then, a Rx demodulator 465 in the receiving terminal 440 demodulates the second modulated encoded code to generate a second demodulated encoded code. An optional Rx frame processor 475 in the receiving terminal 440 may frame process (e.g., remove the previously inserted headers) the second demodulated encoded code to generate deframed encoded code. In addition, an optional deinterleaver 485 in the receiving terminal 440 may deinterleave (e.g., undo the previously used interleavers) the second demodulated encoded code or the deframed encoded code to generate deinterleaved encoded code. Then, a decoder 495 in the receiving terminal 440 decodes the second demodulated encoded code, the deframed encoded code, or the deinterleaved encoded code to generate decoded data (i.e. the recovered data) 460. It should be noted that the decoder 495 corresponds (e.g., uses the same coding algorithms) with the encoder 415 in the transmitting terminal 420.

Figure 5:
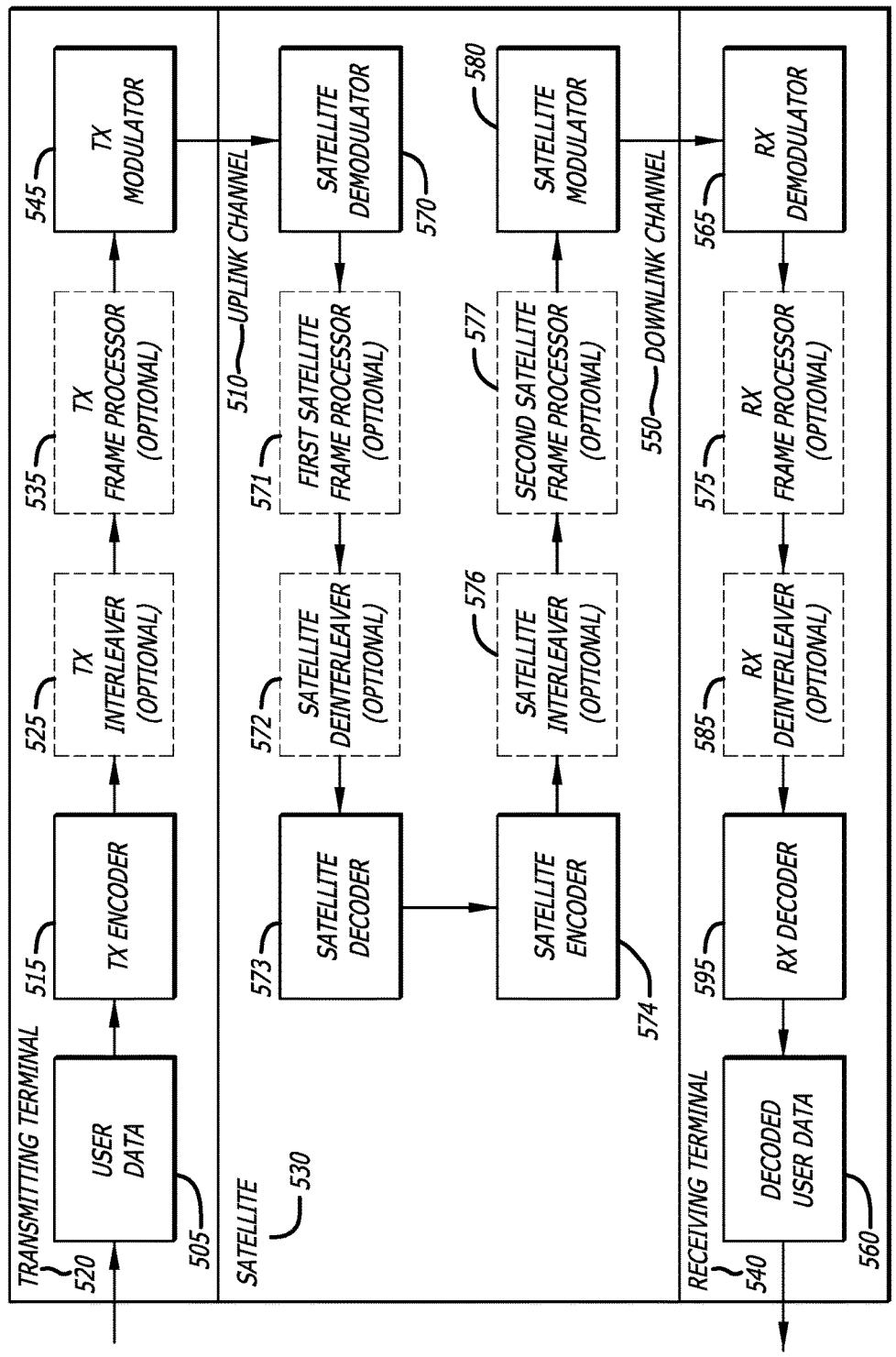
FIG. 5 is a block diagram depicting a conventional full processing satellite system architecture.

FIG. 5 is a block diagram depicting a conventional full processing satellite system architecture 500. In this figure, the transmitting terminal 520 is shown to include a Tx encoder 515; the satellite 530 is shown to include both a satellite encoder 574 and a satellite decoder 573; and the receiving terminal 540 is shown to include a Rx decoder 595.

During operation of the system of FIG. 5, the Tx encoder 515 in the transmitting terminal 520 encodes (e.g., using an error correcting code, such as forward error correction (FEC)) data 505 (e.g., user data, communication data, and/or command data) to generate a first encoded code. Then, an optional Tx interleaver 525 in the transmitting terminal 520 may interleave (e.g., using interleavers, such as rectangular interleavers, convolutional interleavers, random interleavers, and/or S-random interleavers) the first encoded code to generate a first interleaved encoded code. An optional Tx frame processor 535 in the transmitting terminal 520 may frame process (e.g., inserting headers into the code) the first encoded code or the first interleaved encoded code to generate a first framed encoded code. Then, a Tx modulator 545 in the transmitting terminal 520 modulates the first encoded code, the first interleaved encoded code, or the first framed encoded code to generate a first modulated encoded code.

Then, the first modulated encoded code is transmitted from a transmit antenna (not shown) at the transmitting terminal 520 to a satellite antenna (not shown) on the satellite 530 via an uplink signal 510. A satellite demodulator 570 in the satellite 530 then demodulates the first modulated encoded code to generate a first demodulated encoded code.

Then, an optional first satellite frame processor 571 in the satellite 530 may frame process (e.g., inserting headers into the code) the first demodulated encoded code to generate a first deframed encoded code. An optional satellite deinterleaver 572 in the satellite 530 may deinterleave (e.g., undo the previously used interleavers) the first demodulated encoded code or the first deframed encoded code to generate a first deinterleaved encoded code.

Then, a satellite decoder 573 in the satellite 530 decodes the first demodulated encoded code, the first deframed encoded code, or the first deinterleaved encoded code to generate a first decoded code. It should be noted that the satellite decoder 573 corresponds (e.g., uses the same coding algorithms) with the Tx encoder 515 in the transmitting terminal 520. Then, a satellite encoder 574 in the satellite 530 encodes (e.g., using an error correcting code, such as forward error correction (FEC)) the first decoded code to generate a second encoded code.

An optional satellite interleaver 576 in the satellite 530 may interleave (e.g., using interleavers, such as rectangular interleavers, convolutional interleavers, random interleavers, and/or S-random interleavers) the second encoded code to generate a second interleaved encoded code. Also, an optional second satellite frame processor 577 in the satellite 530 may frame process (e.g., inserting headers into the code) the second encoded code or the second interleaved encoded code to generate a second framed encoded code. Then, a satellite modulator 580 in the satellite 530 modulates the second encoded code, the second interleaved encoded code, or the second framed encoded code to generate a second modulated encoded code. The second modulated encoded code is transmitted from the satellite antenna (not shown) to a receive antenna (not shown) in the receiving terminal 540 via a downlink signal 550.

Then, a Rx demodulator 565 in the receiving terminal 540 demodulates the second modulated encoded code to generate a second demodulated encoded code. An optional Rx frame processor 575 in the receiving terminal 540 may frame process (e.g., remove the previously inserted headers) the second demodulated encoded code to generate a second deframed encoded code. In addition, an optional Rx deinterleaver 585 in the receiving terminal 540 may deinterleave (e.g., undo the previously used interleavers) the second demodulated encoded code or the second deframed encoded code to generate a second deinterleaved encoded code. Then, a Rx decoder 595 in the receiving terminal 540 decodes the second demodulated encoded code, the second deframed encoded code, or the second deinterleaved encoded code to generate decoded data (i.e. the recovered data) 560. It should be noted that the Rx decoder 595 corresponds (e.g., uses the same coding algorithms) with the satellite encoder 574 in the satellite 530.

Figure 6:
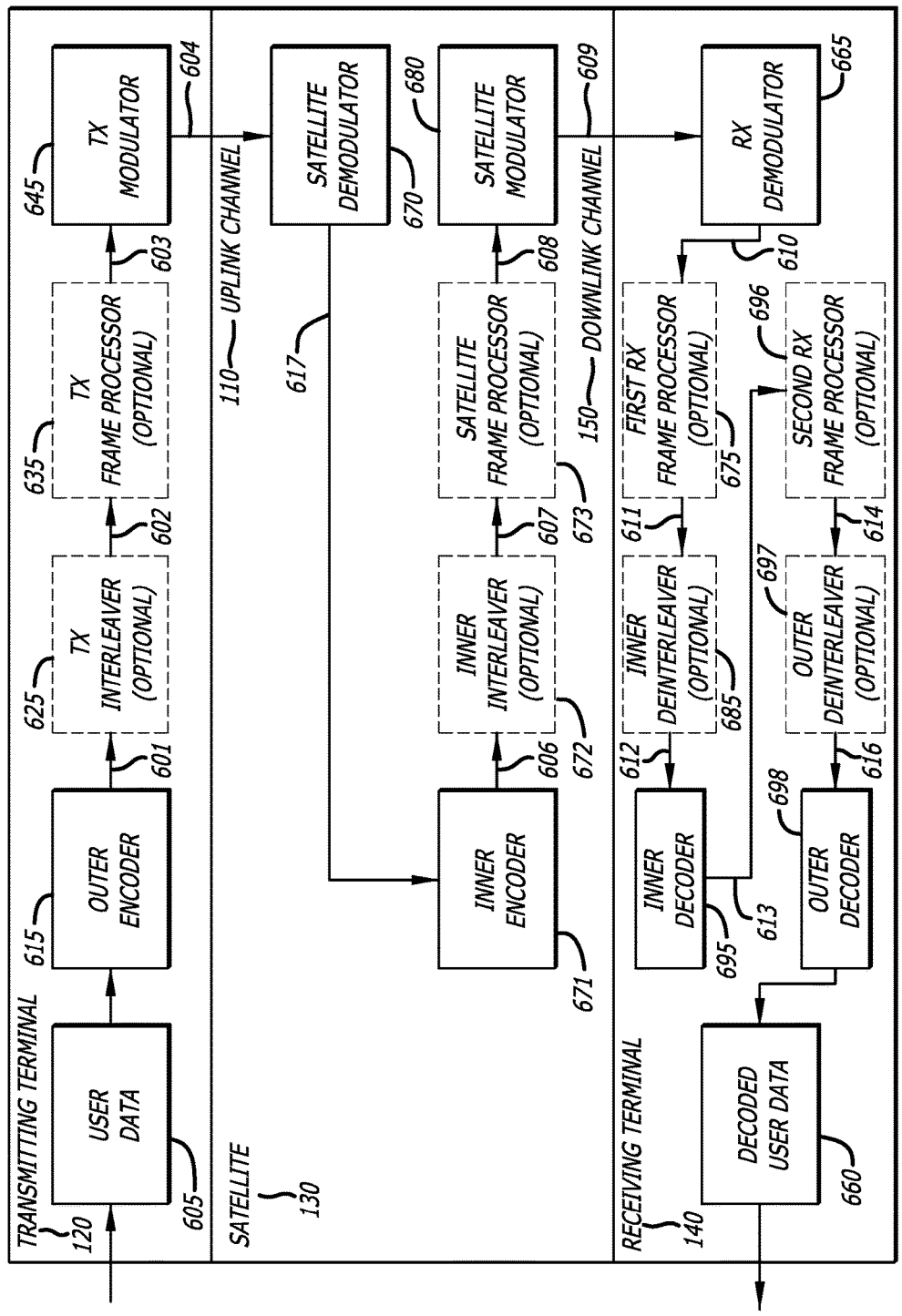
FIG. 6 is a block diagram showing the disclosed enhanced partial processing satellite architecture, in accordance with at least one embodiment of the present disclosure.

FIG. 6 is a block diagram showing the disclosed enhanced partial processing satellite architecture 600, in accordance with at least one embodiment of the present disclosure. In this figure, the transmitting terminal 120 is shown to include an outer encoder 615, and the receiving terminal 140 is shown to include an inner decoder 695 and an outer decoder 698. The satellite 130 includes an inner encoder 671, and is without any decoders.

During operation of the system of FIG. 6, the outer encoder 615 in the transmitting terminal 120 encodes (e.g., using an error correcting code, such as forward error correction (FEC)) data 605 (e.g., user data, communication data, and/or command data) to generate an outer code 601. It should be noted that various different types of error correcting codes may be utilized by the outer encoder 615 including, but not limited to, FEC codes, such as concatenated FEC codes (e.g., refer to FIG. 8). These FEC codes may have their own inner and outer codes (not shown), which are distinct from the inner and outer codes as defined in the present disclosure.

Then, an optional outer interleaver 625 in the transmitting terminal 120 may interleave (e.g., using interleavers, such as rectangular interleavers, convolutional interleavers, random interleavers, and/or S-random interleavers) the outer code 601 to generate an interleaved outer code 602. An optional transmit (Tx) frame processor 635 in the transmitting terminal 120 may frame process (e.g., inserting headers into the code) the outer code 601 or the interleaved outer code 602 to generate a framed outer code 603. It should be noted that the Tx frame processor 635 is referred to as such because it is a frame processor that is located within the transmitting terminal 120.

Then, a Tx modulator 645 in the transmitting terminal 120 modulates the outer code 601, the interleaved outer code 602, or the framed outer code 603 to generate a modulated outer code 604. Various different modulation schemes may be employed by the Tx modulator 645 including, but not limited to, modulation schemes that vary frequency, amplitude, and/or phase. Similar to the Tx frame processor 635, the Tx modulator 645 is referred to as such because it is a modulator that is located within the transmitting terminal 120.

Then, the modulated outer code 604 is transmitted from a transmit antenna (refer to 125 in FIG. 1) at the transmitting terminal 120 to a satellite antenna (refer to 135 in FIG. 1) on the satellite 130 via an uplink signal 110. A satellite demodulator 670 in the satellite 130 then demodulates the modulated outer code 604 to generate a demodulated outer code 617. The satellite demodulator 670 corresponds (e.g., utilizes the same modulation scheme(s)) with the Tx modulator 645 in the transmitting terminal 120.

Then, an inner encoder 671 in the satellite 130 encodes (e.g., using an error correcting code, such as forward error correction (FEC)) the demodulated outer code 617 to generate an inner code 606. Various different types of error correcting codes may be utilized by the inner encoder 671 including, but not limited to, FEC codes, such as concatenated FEC codes (e.g., refer to FIG. 8). These FEC codes may have their own inner and outer codes (not shown), which are distinct from the inner and outer codes as defined in the present disclosure.

An optional inner interleaver 672 in the satellite 130 may interleave (e.g., using interleavers, such as rectangular interleavers, convolutional interleavers, random interleavers, and/or S-random interleavers) the inner code 606 to generate an interleaved inner code 607. Also, an optional satellite frame processor 673 in the satellite 130 may frame process (e.g., inserting headers into the code) the inner code 606 or the interleaved inner code 607 to generate framed inner code 608. Then, a satellite modulator 680 in the satellite 130 modulates the inner code 606, the interleaved inner code 607, or the framed inner code 608 to generate a modulated inner code 609. It should be noted that various different modulation schemes may be employed by the satellite modulator 680 including, but not limited to, modulation schemes that vary frequency, amplitude, and/or phase.

The modulated inner code 609 is transmitted from the satellite antenna (refer to 135 in FIG. 1) to a receive antenna (refer to 145 in FIG. 1) in the receiving terminal 140 via a downlink signal 150. Then, a receive (Rx) demodulator 665 in the receiving terminal 140 demodulates the modulated inner code 609 to generate a demodulated inner code 610. It should be noted that the Rx demodulator 665 is referred to as such because it is a modulator that is located within the receiving terminal 140. The Rx demodulator 665 corresponds (e.g., utilizes the same modulation scheme(s)) with the satellite modulator 680 in the satellite 130.

An optional first Rx frame processor 675 in the receiving terminal 140 may frame process (e.g., undo the previously used headers) the demodulated inner code 610 to generate a deframed inner code 611. The first Rx frame processor 675 is referred to as such because it is a frame processor that is located within the receiving terminal 140. In addition, an optional inner deinterleaver 685 in the receiving terminal 140 may deinterleave (e.g., remove the previously inserted interleavers) the demodulated inner code 610 or the deframed inner code 611 to generate a deinterleaved inner code 612.

Then, an inner decoder 695 in the receiving terminal 140 decodes the demodulated inner code 610, the deframed inner code 611, or the deinterleaved inner code 612 to generate recovered outer code 613. It should be noted that the inner decoder 695 corresponds (e.g., uses the same coding algorithms) with the inner encoder 671 in the satellite 130.

Then, an optional second Rx frame processor 696 in the receiving terminal 140 may frame process (e.g., inserting headers into the code) the recovered outer code 613 to generate deframed outer code 614. Similar to the first Rx frame processor 675, the second Rx frame processor 696 is referred to as such because it is a frame processor that is located within the receiving terminal 140.

An optional outer deinterleaver 697 in the receiving terminal 140 may deinterleave (e.g., undo the previously used interleavers) the recovered outer code 613 or the deframed outer code 614 to generate a deinterleaved outer code 616. Then, an outer decoder 698 in the receiving terminal 140 decodes the recovered outer code 613, the deframed outer code 614, or the deinterleaved outer code 616 to generate recovered data 660. It should be noted that the outer decoder 698 corresponds (e.g., uses the same coding algorithms) with the outer encoder 615 in the transmitting terminal 120.

FIGS. 7A and 7B together are a flow chart showing the disclosed method for enhanced partial processing of satellite user data, in accordance with at least one embodiment of the present disclosure. At the start 705 of the method, an outer encoder in a transmitting terminal encodes data to generate an outer code 710. An optional transmit interleaver in the transmitting terminal may interleave the outer code to generate interleaved outer code 715. Also, an optional transmit frame processor in the transmitting terminal may frame process the outer code or the interleaved outer code to generate framed outer code 720. Then, a transmit modulator in the transmitting terminal modulates the outer code, the interleaved outer code, or the framed outer code to generate modulated outer code 725.

A satellite demodulator in a satellite then demodulates the modulated outer code to generate demodulated outer code 730. Then, an inner encoder in the satellite encodes the demodulated outer code to generate inner code 735. An optional satellite interleaver in the satellite may interleave the inner code to generate interleaved inner code 740. An optional satellite frame processor in the satellite may frame process the inner code or the interleaved inner code to generate framed inner code 745. Then, a satellite modulator in the satellite modulates the inner code, the interleaved inner code, or the framed inner code to generate modulated inner code 750.

A receive demodulator in a receiving terminal then demodulates the modulated inner code to generate demodulated inner code 755. Then, an optional first receive frame processor in the receiving terminal may frame process the demodulated inner code to generate deframed inner code 760. An optional inner deinterleaver in the receiving terminal may deinterleave the demodulated inner code or the deframed inner code to generate deinterleaved inner code 765. Then, an inner decoder in the receiving terminal decodes the demodulated inner code, the deframed inner code, or the deinterleaved inner code to generate recovered outer code 770. An optional second receive frame processor in the receiving terminal may frame process the recovered outer code to produce deframed outer code 775. An optional outer deinterleaver in the receiving terminal may deinterleave the recovered outer code or the deframed outer code to generate deinterleaved outer code 780. An outer decoder in the receiving terminal decodes the recovered outer code, the deframed outer code, or the deinterleaved outer code to generate recovered data 785. Then, the method ends 790.

FIG. 8 is a schematic diagram showing an exemplary forward error correction (FEC) concatenated code for the outer code 601 of FIG. 6 and an exemplary FEC concatenated code for the inner code 606 of FIG. 6 that may be employed by the disclosed system for enhanced partial processing of satellite user data, in accordance with at least one embodiment of the present disclosure. In one or more embodiments, during operation of the disclosed system, data (e.g., user data) 605 (also refer to FIG. 6) is encoded, by an outer encoder 615 (refer to FIG. 6), utilizing a FEC concatenated coding scheme to generate the outer code 601. In this figure, the generated outer code 601 is shown to contain (1) a header (HDR) (which contains header information), followed by (2) the original user data, which is followed by (3) parity (which comprises a sequence of parity bits). Also during operation of the disclosed system, the outer code 601 (e.g., in the form of demodulated outer code 617) is encoded, by an inner encoder 671 (refer to FIG. 6), utilizing a FEC concatenated coding scheme to generate the inner code 606. In this figure, the generated inner code 606 is shown to contain (1) the header (HDR) (which contains header information) in the outer code 601, followed by (2) a subsequent header (HDR) (which contains additional header information), which is followed by (3) the original user data, which is followed by (4) the parity (which comprises a sequence of parity bits) in the outer code 601, which is then followed by (5) additional parity (which comprises a sequence of parity bits).

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more parts or less part of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

What is claimed is:

1. A method for processing data, the method comprising:
   encoding, with an outer encoder in a transmitting terminal, data to generate an outer code;
   modulating, with a transmit modulator in the transmitting terminal, one of the outer code, interleaved outer code, or framed outer code to generate modulated outer code;
   demodulating, with a satellite demodulator in a satellite, the modulated outer code to generate demodulated outer code;
   encoding, with an inner encoder in the satellite, the demodulated outer code to generate inner code;
   modulating, with a satellite modulator in the satellite, one of the inner code, interleaved inner code, or framed inner code to generate modulated inner code;
   demodulating, with a receive demodulator in a receiving terminal, the modulated inner code to generate demodulated inner code;
   decoding, with an inner decoder in the receiving terminal, one of the demodulated inner code, deframed inner code, or deinterleaved inner code to generate recovered outer code; and
   decoding, with an outer decoder in the receiving terminal, one of the recovered outer code, deframed outer code, or deinterleaved outer code to generate recovered data.

2. The method of claim 1, wherein the method further comprises at least one of:
   interleaving, by an outer interleaver in the transmitting terminal, the outer code to generate the interleaved outer code, prior to the modulating by the transmit modulator; or
   frame processing, by a transmit frame processor in the transmitting terminal, one of the outer code or the interleaved outer code to generate the framed outer code, prior to the modulating by the transmit modulator.

3. The method of claim 1, wherein the method further comprises at least one of:
   interleaving, by a satellite interleaver in the satellite, the inner code to generate the interleaved inner code, prior to the modulating by the satellite modulator; or
   frame processing, by a satellite frame processor in the satellite, one of the inner code or the interleaved inner code to generate the framed inner code, prior to the modulating by the satellite modulator.

4. The method of claim 1, wherein the method further comprises at least one of:

frame processing, by a first receive frame processor in the receiving terminal, the demodulated inner code to generate the deframed inner code, prior to the decoding by the inner decoder; or deinterleaving, by an inner deinterleaver in the receiving terminal, one of the demodulated inner code or the deframed inner code to generate the deinterleaved inner code, prior to the decoding by the inner decoder.

5. The method of claim 1, wherein the method further comprises at least one of:

frame processing, by a second receive frame processor in the receiving terminal, the recovered outer code to produce deframed outer code, prior to the decoding by the outer decoder; or deinterleaving, by an outer deinterleaver in the receiving terminal, one of the recovered outer code or the deframed outer code to generate the deinterleaved outer code, prior to the decoding by the outer decoder.

6. The method of claim 1, wherein the data is at least one of communication data, command data, or user data.

7. The method of claim 1, wherein at least one of the outer encoder or the inner encoder performs forward error correction (FEC) encoding.

8. The method of claim 1, wherein at least one of the outer decoder or the inner decoder performs FEC decoding.

9. The method of claim 1, wherein the outer decoder corresponds to the outer encoder, and the inner decoder corresponds to the inner encoder.

10. The method of claim 1, wherein the transmitting terminal and the receiving terminal are each one of a ground station, a mobile device, or a vehicle.

11. A system for processing data, the system comprising:

an outer encoder in a transmitting terminal to encode data to generate an outer code;

a transmit modulator in the transmitting terminal to modulate one of the outer code, interleaved outer code, or framed outer code to generate modulated outer code;

a satellite demodulator in a satellite to demodulate the modulated outer code to generate demodulated outer code;

an inner encoder in the satellite to encode the demodulated outer code to generate inner code;

a satellite modulator in the satellite to modulate one of the inner code, interleaved inner code, or framed inner code to generate modulated inner code;

a receive demodulator in a receiving terminal to demodulate the modulated inner code to generate demodulated inner code;

an inner decoder in the receiving terminal to decode one of the demodulated inner code, deframed inner code, or deinterleaved inner code to generate recovered outer code; and an outer decoder in the receiving terminal to decode one of the recovered outer code, deframed outer code, or deinterleaved outer code to generate recovered data.

12. The system of claim 11, wherein the system further comprises at least one of:

an outer interleaver in the transmitting terminal to interleave the outer code to generate the interleaved outer code, prior to the modulating by the transmit modulator; or a transmit frame processor in the transmitting terminal to frame process one of the outer code or the interleaved outer code to generate the framed outer code, prior to the modulating by the transmit modulator.

13. The system of claim 11, wherein the system further comprises at least one of:

a satellite interleaver in the satellite to interleave the inner code to generate the interleaved inner code, prior to the modulating by the satellite modulator; or a satellite frame processor in the satellite to frame process one of the inner code or the interleaved inner code to generate the framed inner code, prior to the modulating by the satellite modulator.

14. The system of claim 11, wherein the system further comprises at least one of:

a first receive frame processor in the receiving terminal to frame process the demodulated inner code to generate the deframed inner code, prior to the decoding by the inner decoder; or an inner deinterleaver in the receiving terminal to deinterleave one of the demodulated inner code or the deframed inner code to generate the deinterleaved inner code, prior to the decoding by the inner decoder.

15. The system of claim 11, wherein the system further comprises at least one of:

a second receive frame processor in the receiving terminal to frame process the recovered outer code to produce the deframed outer code, prior to the decoding by the outer decoder; or an outer deinterleaver in the receiving terminal to deinterleave one of the recovered outer code or the deframed outer code to generate the deinterleaved outer code, prior to the decoding by the outer decoder.

16. The system of claim 11, wherein the data is at least one of communication data, command data, or user data.

17. The system of claim 11, wherein at least one of the outer encoder or the inner encoder is operable to perform forward error correction (FEC) encoding.

18. The system of claim 11, wherein at least one of the outer decoder or the inner decoder is operable to perform FEC decoding.

19. The system of claim 11, wherein the outer decoder corresponds to the outer encoder, and the inner decoder corresponds to the inner encoder.

20. The system of claim 11, wherein the transmitting terminal and the receiving terminal are each one of a ground station, a mobile device, or a vehicle.

* * * * *